United States Patent
Feigenbaum

(10) Patent No.: US 10,612,145 B2
(45) Date of Patent: Apr. 7, 2020

(54) NANOSTRUCTURED LAYER FOR GRADED INDEX FREEFORM OPTICS

(71) Applicant: Lawrence Livermore National Security, LLC, Livermore, CA (US)

(72) Inventor: Eyal Feigenbaum, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1 day.

(21) Appl. No.: 15/625,258

(22) Filed: Jun. 16, 2017

(65) Prior Publication Data
US 2018/0363148 A1    Dec. 20, 2018

(51) Int. Cl.
| | |
|---|---|
| *B41J 2/16* | (2006.01) |
| *C23F 1/00* | (2006.01) |
| *C23F 1/44* | (2006.01) |
| *G02B 1/00* | (2006.01) |
| *G02B 3/00* | (2006.01) |
| *H01L 21/263* | (2006.01) |
| *H01L 21/306* | (2006.01) |
| *H01L 21/3065* | (2006.01) |
| *H01L 21/3105* | (2006.01) |
| *H01L 21/768* | (2006.01) |

(52) U.S. Cl.
CPC .............. *C23F 1/00* (2013.01); *B41J 2/1626* (2013.01); *B41J 2/1628* (2013.01); *B41J 2/1629* (2013.01); *C23F 1/44* (2013.01); *G02B 1/00* (2013.01); *H01L 21/2633* (2013.01); *H01L 21/3065* (2013.01); *H01L 21/30608* (2013.01); *H01L 21/31056* (2013.01); *H01L 21/76808* (2013.01)

(58) Field of Classification Search
None
See application file for complete search history.

(56) References Cited

U.S. PATENT DOCUMENTS

2009/0130427 A1* 5/2009 Grigoropoulos ......... B41M 5/42
                                                                    428/323
2011/0207328 A1    8/2011 Speakman
(Continued)

FOREIGN PATENT DOCUMENTS

| CN | 102097535 A | 6/2011 |
|---|---|---|
| JP | 2008053666 A | 3/2008 |

(Continued)

OTHER PUBLICATIONS

Ruffino et al, Controlled Dewetting as Fabrication and Patterning Strategy for Metal Nanostructures, Jun. 2015, Phys.Status Solidi A, vol. 212, Issue 8, 1662-1684. (Year: 2015).*

(Continued)

*Primary Examiner* — Stephanie P Duclair
(74) *Attorney, Agent, or Firm* — Harness, Dickey & Pierce, PLC

(57) ABSTRACT

The present disclosure relates to a method for creating an optical component having a spatially controlled refractive index. The method may involve applying a thin metal material layer to a substrate. The thin metal material layer may then be heated to create a mask having a spatially varying nano-particle distribution. The substrate may then be etched, using the mask, to imprint a spatially patterned nanostructure pattern on a surface the substrate.

19 Claims, 3 Drawing Sheets

(56) References Cited

U.S. PATENT DOCUMENTS

| | | | | |
|---|---|---|---|---|
| 2015/0014891 A1* | 1/2015 | Amatucci | ................ | C23F 4/02 |
| | | | | 264/447 |
| 2015/0037918 A1* | 2/2015 | Donofrio | ............... | H01L 33/20 |
| | | | | 438/29 |
| 2016/0201189 A1* | 7/2016 | Palacios-Laloy | ....... | C03C 17/36 |
| | | | | 136/256 |

FOREIGN PATENT DOCUMENTS

| | | |
|---|---|---|
| KR | 20150137942 A | 12/2015 |
| WO | 2013171284 A1 | 11/2013 |

OTHER PUBLICATIONS

Gentili et al, Applications of Dewetting in Micro and Nanotechnology, 2012, The Royal Society of Chemistry, vol. 41 pp. 4430-4443.*
Trice et al, Pulsed Laser Induced Dewetting in Nanoscopic Metal Films: Theory and Experiments, 2007, The American Physical Society. vol. 75 pp. 235439-1: 253439-15.*
International Search Report and Written Opinion for corresponding International Application No. PCT/US2018/024777 dated Jul. 17, 2018, 10 pages.

* cited by examiner

NANOSTRUCTURED LAYER FOR GRADED INDEX FREEFORM OPTICS

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to systems and methods for forming optical components, and more particularly to systems and methods for forming an optical element having a spatially varying refractive index.

BACKGROUND

This section provides background information related to the present disclosure which is not necessarily prior art.

Large optics fabrication techniques are key enablers of lightweight space applications and high power laser systems, especially where the power is usually carried by large aperture beams to reduce the intensity. For both fields, technologies that have the flexibility to allow for freeform optics and complex alternating optics such as gratings are desirable. One example for useful freeform operations may involve correcting high order aberrations for traditionally built lenses. Another example is with contour phase plates (CPP) for inertial confinement fusion (ICF) laser systems, and combining optical functions for light-wave systems.

Existing technologies for producing large-scale optics with free form flexibility are diamond turning polishing and Magnetorheological Finishing (MRF). However, the diamond turning polishing technique provides limited surface quality with respect to optical grade. Furthermore, its laser damage resilience, without further surface treatment, may alter the surface morphology, and therefore is relatively low. MRF can produce a high quality surface but is time consuming to perform. Still further, the resulting maximal modulation of an optical function with MRF manufactured optic is limited by the small material removal and the spatial resolution that are achievable with MRF.

Uniform random nanostructured Silica may be used as an anti-reflective (AR) layer for high power laser systems with proven high laser-induced damage threshold. This nanostructured AR layer replaces traditional AR coating by introducing effectively the same refractive index at a thin layer near the substrate surface. This results from insensitivity of the wave to the specific features due to their subwavelength lateral scale as the wave reacts to the net weighted averaged refractive index. These nanostructured AR layers are fabricated using Reactive Ion Etching (RIE) resulting in a random rough surface with subwavelength features. This technique is limited to application of spatially uniform refractive index layer, where the feature-size distribution across the structure is being controlled by the etching reactant and exposure.

One particular method to create nano-sized metal particles on a substrate is by thermally de-wetting a thin metal layer. This procedure turns a portion of the metal layer into metal particles with size distribution controlled by the deposited thermal energy. In effect, the metal film melts and then balls up into liquid droplets on the surface, followed by the formation of metal nano-particles as these droplets cool and re-solidify.

SUMMARY

This section provides a general summary of the disclosure, and is not a comprehensive disclosure of its full scope or all of its features.

In one aspect the present disclosure relates to a method for creating an optical component having a spatially controlled refractive index. The method may comprise initially applying a thin metal material layer to a substrate. The thin metal material layer may then be heated to create a mask having a spatially varying nano-particle distribution. The substrate may then be etched using the mask to imprint a spatially patterned nanostructure pattern on a surface of the substrate.

In another aspect the present disclosure relates to a method for creating an optical component having a spatially controlled refractive index. The method may comprise applying a thin metal layer to a substrate, and then de-wetting the thin metal layer using an optical signal to create a mask having a spatially varying nano-particle distribution. The substrate may then be etched using the mask to imprint a spatially patterned nanostructure pattern on a surface of the substrate. Finally, the mask may be removed.

In still another aspect the present disclosure relates to a method for creating an optical component having a spatially controlled refractive index. The method may comprise applying a thin metal layer to a substrate. A laser may then be used to perform de-wetting of the thin metal layer to create a mask having a spatially varying nano-particle distribution. Reactive ion etching may then be used to dry etch the substrate, using the mask to control the etching. This imprints a spatially controlled, graded index surface on the substrate. Finally, the mask may be removed.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

In the Figures, corresponding reference numerals indicate corresponding parts throughout the several views of the drawings.

DETAILED DESCRIPTION

Example embodiments will now be described more fully with reference to the accompanying drawings.

The present disclosure provides a method for creating and using a spatially varying size-distribution of metal particles as a metal mask layer, whereas the mask layer is formed on a substrate by using a spatially varying laser exposure for the de-wetting of a thin metal layer. Subsequent reactive ion etching (RIE) then allows the completed mask layer to be used in imparting the mask onto the substrate. The result is an optical element having a highly controlled, spatially varying refractive index (i.e., a graded-index (GRIN)). The system and method of the present disclosure enables the construction of a designer-at-will free form optical element, for example a phase plate, grating, lens or virtually any other form of optical element. The metal layer dewetting could be implemented by any method of spatially controllable thermal irradiation onto a surface, for example thermal processing, pulsed lasers, light emitting diodes (LEDs), diode-laser arrays or other illumination sources. The transfer of the mask details to the substrate could be implemented by any method of preferential etch, for example RIE or wet etching. The method of the present disclosure, and its variations, are especially well suited to large optics, because of its use of inherently scalable manufacturing techniques such as planar layer deposition, spatially shaped light exposure or spatially raster laser beam and RIE or wet etching. The resulting optical component has a high laser damage threshold, similar to the uniform random nanostructured AR layers on silica.

Figure 1:
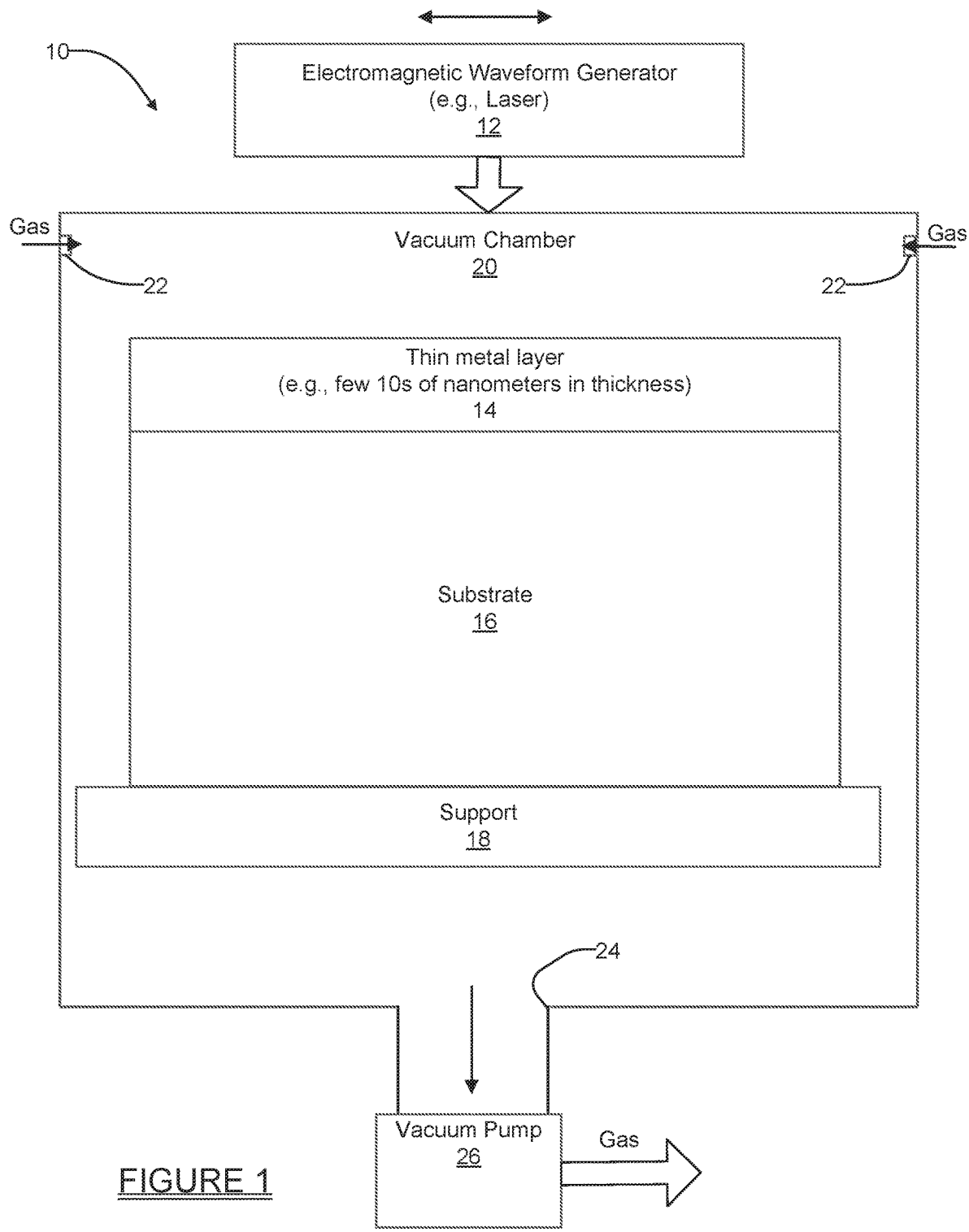
FIG. 1 is a high level diagram of one example of a system in accordance with the present disclosure that may be used to produce a highly controlled, spatially varying refractive index on a substrate.

Referring to FIG. 1, there is shown a high level diagram of one embodiment of a system 10 that may be used to create optical components having spatially controlled refractive indices. The system 10 may include an electromagnetic waveform generator 12 that can be a raster scanned light beam or otherwise a light beam that is reshaped by passing it through an illumination mask to irradiate a thin metal material layer 14 present on a substrate 16. In one example the electromagnetic waveform generator 12 may be a reshaped laser beam, and simply by way of example, this component will be referred to throughout the following discussion as "laser 12". The substrate 16 may take the form of glass, plastic or any other material suitable for forming an optical component. The thin metal material layer 14 may be, for example Gold (Au), Silver (Ag) or Chromium (Cr), and quite thin, relatively speaking, when compared to the substrate 16, and typically may be on the order of 1-100 nanometers in thickness, and even more typically between 10-50 nanometers in thickness. However, it will be appreciated that the system 10 and the methodology described herein is not limited to use with a metal material layer of any specific thickness.

The substrate 16 with the metal material layer 14 thereon may be supported on a support 18 disposed in a vacuum chamber 20. The vacuum chamber 20 may have one or more ports 22 at one end thereof to admit a gas, and at least one opening 24 at an opposite end of the chamber which is in communication with a vacuum pump 26.

Figure 2:
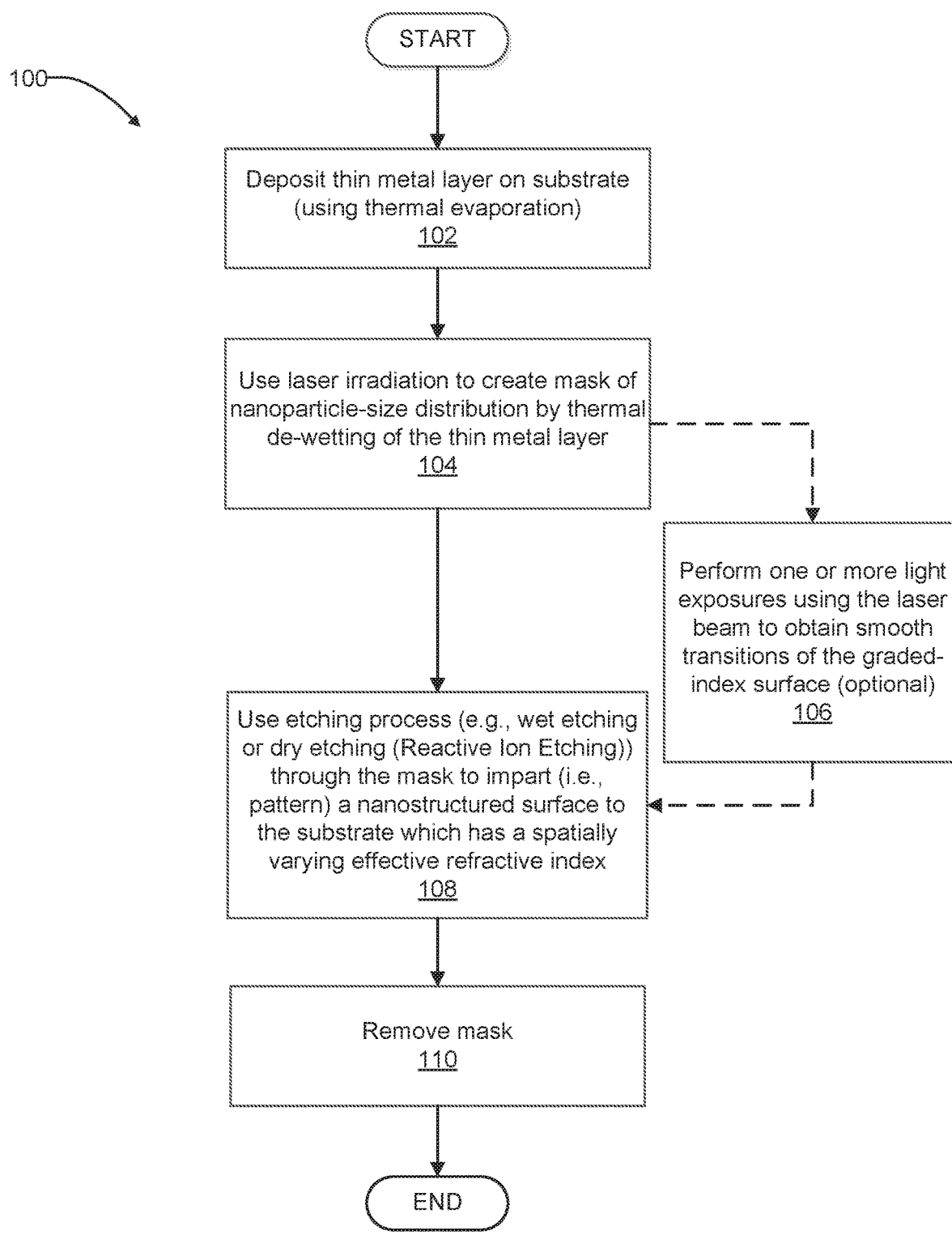
FIG. 2 is a flowchart illustrating various operations that may be performed in creating a highly controlled, spatially varying index on a substrate.

The system 10 described above may be used in accordance with the present disclosure to implement the manufacturing operations set forth in the flowchart 100 of FIG. 2. Referring to FIG. 2, initially at operation 102 the thin metal layer 14 may be formed using a suitable deposition process, for example thermal evaporation. However, any suitable material deposition process may be used.

Figure 3:
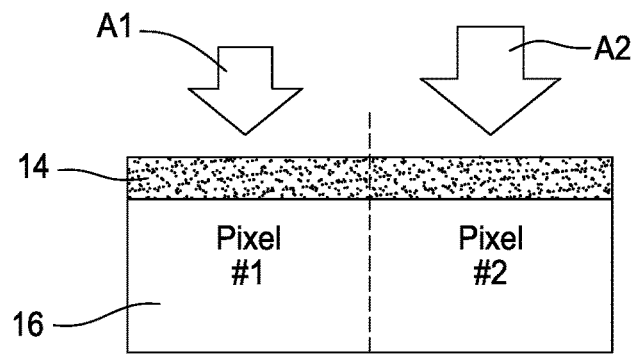
FIG. 3 is a simplified side view of a thin metal layer formed on a substrate, with portions of the substrate being designated as specific pixels, and where the thin metal layer is about to be de-wetted.
Figure 4:
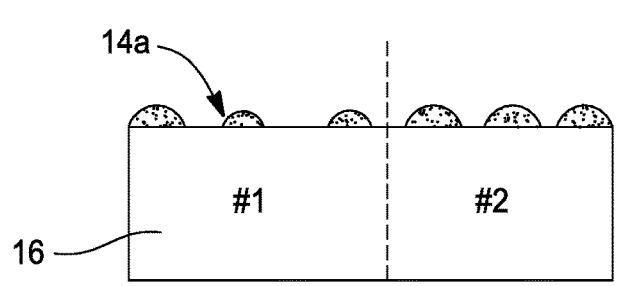
FIG. 4 is a view of the substrate and the thin metal layer after de-wetting, illustrating the nano-particle features of the formed mask.
Figure 5:
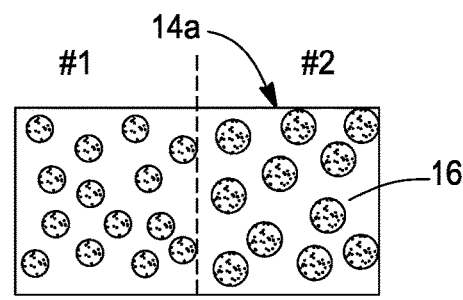
FIG. 5 is a plan (top) view of the mask of FIG. 4 with portions of the substrate visible as well through portions of the mask.

At operation 104 irradiation from the laser 12 may be used to create a mask of nanoparticle-size distribution by thermal de-wetting of the thin metal layer 14. This may involve one or more light exposures of the laser 12, as indicated by operation 106. Alternatively, this may involve a plurality of exposures taken using the laser 12 with a raster scan like movement back and forth over the thin metal layer 14. Particularly smooth transitions of the graded-index (GRIN), or obtaining features even smaller than the beam size of the laser 12, may be achieved using overlapped multiple passes of the laser beam. Using the spatially controlled irradiation provided by the laser 12, either through multiple overlapped passes or through different fluence or controlling a number of pulses of laser light, enables the thin metal layer 14 to be de-wetted to take the form of a nano-featured mask 14*a*, such as shown in FIGS. 3-5. The mask 14*a* has a highly controlled, nano-particle distribution that is spatially varying over the area of the mask 14*a*. The nano-particle distribution essentially forms a nano-particle featured pattern which imparts different thicknesses and widths throughout the mask 14*a*. This is also illustrated in FIG. 3, with arrows A1 and A2 representing different controlled light exposures being applied to different portions of the thin metal layer 14 to create different nano-particle distributions. FIG. 4 is a highly simplified side view of the mask 14*a* created from the thin metal layer 14, and FIG. 5 is a plan (i.e., top) view of the newly formed mask 14*a* further illustrating the spatially varying nano-particle distributions. While shaped laser beam or rastered laser beam illumination may be a particularly preferred method for forming the nano-particle featured mask 14*a* from the metal layer 14, it will be appreciated that other methods, such as thermal processing, light emitting diodes and other illumination sources could also be used. The use of a laser beam, however, allows for excellent control of the energy temporal deposition profile, better spatial control, and provides advantages with respect to temperature sensitive substrates.

Figure 6:
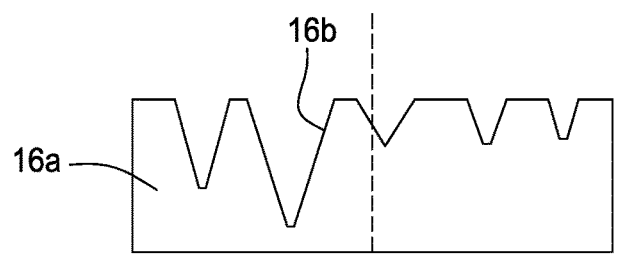
FIG. 6 is a side view of the substrate of FIG. 4 after the etching step and mask removal showing the sub-wavelength features patterned onto the substrate.

Referring to operation 108, a wet or dry etching process may then be used to etch an upper surface of the substrate 16 using the mask 14*a*. One particularly effective etching method is Reactive Ion Etching (RIE). The etching on the mask 14*a* imparts (i.e., patterns) the mask onto the upper surface of the substrate 16 to create a patterned substrate 16*a* (FIG. 6). At operation 110 the mask may be removed, such as by etching, leaving the patterned substrate 16*a* with a nano-featured surface as shown in FIG. 6. While RIE may be a particularly preferred method for imparting the nano-particle features of the mask 14*a* onto the upper surface of the substrate 16, it will be appreciated that other methods, such wet etching, could also be used.

From FIG. 6, it will be noted that the RIE operation to create the patterned substrate 16*a* provides for high-aspect ratio surface features 16*b* to be etched into the surface of the patterned substrate 16*a*. After the removal of the mask 14*a*, the resulting patterned substrate 16*a* may be used as a phase plate to implement a "designer at will" freeform optical element, as well as a traditional optical element.

It will also be appreciated that the GRIN spatial variation is limited by the depth of the RIE etching while maintaining the feature's subwavelength lateral scale. Assuming about 1:10 aspect ratio, and features smaller than the wavelength, the method of the present disclosure may potentially reach a few waves equivalent change in GRIN. This potentially enables implementation of freeform optical functions requiring up to a few waves amplitude without using a diffractive optics design (i.e., without using the fact that the phase plate has multi-equivalent planes with 2pi modulus spacing), which is a wavelength sensitive and incident angle sensitive design. This provides an advantage for short power laser operation, which is frequently used to achieve high power operation. Deeper wave amplitude functions are enabled by implementing diffractive optics design principles—yet with the advantage of high laser resilience.

The method of the present disclosure could be implemented using different method variations to optimize it for different applications. The de-wetting step of the thin metal layer 14, resulting in the etch mask 14a, could be implemented using various methods of heat deposition. Some examples are thermal annealing in a furnace, or by a pulsed laser, LED or laser diodes array, or other illumination sources. While thermal annealing presents a relatively simple solution with high spatial uniformity, the various irradiation methods described herein (e.g., raster scanned laser 12) present temporal energy deposition control (e.g., adjusting the laser pulse shape), spatial control (e.g., laser rastering or shaped transmission masks) and an advantage when using temperature sensitive substrates. The etching step through the mask 14a could be implemented using dry or wet etching methods. While the dry etching (e.g., RIE) may achieve deeper surface modulations, wet etching is still an attractive process as it provides high laser-induced damage thresholds ("LIDT") and further simplicity.

The method of the present disclosure also differs from previous attempts to pattern a substrate because is based on transferring the mask 14a to the substrate 16. This makes the process described herein less sensitive to material properties. Spatial control of the end-result effective refractive index and the layer depth allows printing complex shaped flat optics with high LIDT (e.g., flat lenses, aspheric corrections to lenses), which is not accessible using existing random anti-reflective ("RAR") surface treatment. Existing methods for RAR surface treatment, which are mask-less, are limited only to dry etch, whereas wet etch has a demonstrated high LIDT performance. Wet etch is also attractive as an industrial manufacturing process and expands the application space for the present disclosure.

The method of the present disclosure enables modifying a thin layer at the surface of an optical substrate (e.g., glass) to obtain a lateral spatially programmable (i.e., using pixels representing specific 2D areas) function of refractive index and of depth (in contrast to only depth in the case of surface polishing methods). The programmable 'pixel' expected depth is an optical wavelength scale (about a micron) and its lateral size may be on the scale of a few microns. The lateral resolution may depend on the method which is used to irradiate the thin metal layer 14 with light to create the mask 14a. As noted above, the light may be induced by laser rastering to obtain high spatial resolution or by reshaped beam or interfered beams to obtain a faster exposure process. One alternative that may enable writing the nano-scale features onto the thin metal layer 14 is e-beam lithography. However, e-beam lithography scalability to large samples is limited, although at present could be usable for small area applications.

It will also be appreciated that the refractive index of a 'pixel', (as shown in FIG. 3) is determined by the substrate volume removal from that 'pixel' and controlled by the sub-wavelength metal particle's lateral size. Its value could be designed in the range between the index of the substrate and the index of air. The thickness of the removed layer at the area represented by any particular pixel is controlled by the thickness of the metal particles on the mask 14a and the etching process parameters.

Particular advantages of the system and method of the present disclosure are a high laser damage threshold and enabling scalable application of the method described herein to create large optical components. Still further, the system and method of the present disclosure is not limited to use with only planar optical elements, but can just as readily be applied to optical components having non-planar surfaces.

The system and method of the present disclosure enables new potential applications, especially for high power lasers. For example, the system and method of the present disclosure allows for spatially modified reflectivity of optical surfaces, and thus by introducing such an element into the resonator or featuring the cavity front/back facets, enables laser mode selection.

The combined control of the refractive index and the depth for a 'pixel' enables featuring the surface to function as a combined transmission diffraction grating with anti-reflective layer. The grating profile could be designed to be smoother than the current one step photoresist based technology to improve its performance. Furthermore, this provides the flexibility to modify the grating period spatially, for example to create chirped gratings. This combined function could be applied to gain slabs facets to reduce amplified spontaneous emission (ASE).

The thin metal layer could be designed to function as a thin and a-chromate lens with a large focal length with potential applications for lasers, and especially for short pulse lasers. Furthermore, computer generated holograms with more complex functions than lensing could be designed to the layer, such as beam shaping and high-order aberrations corrections. The spatially preferential writing of a transmission grating with spatially varying properties enables beam reshaping and steering (e.g., to redirect a controlled amount of different regions in the beam towards different targets or excess energy to a beam-dump). The surface properties other than the optical ones may be modified as well, which enables the possibility of designing its mechanical properties as well. One example is self-cleaning optics (i.e., the "Lotus effect"), which involves featuring the surface with nano and micro scale features, which alters the surface to be ultra-hydrophobic.

The teachings of the present disclosure enable large, freeform optical elements to be created that are lightweight and suitable for use with high power laser systems. The systems and methods described herein may be used to create pulse compressing, deflection gratings, contour phase plates (CPP) for ICF systems, and for correcting high order aberrations for traditionally built lenses, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for creating an optical component having a spatially controlled, varying pattern of refractive index over an area of the optical component, the method comprising:
    applying a thin metal material layer to a substrate;
    heating the thin metal material layer using a predetermined, spatially controlled irradiation profile, using pixels representing specific 2D areas, to create a mask having a controlled, varying nano-particle distribution which varies spatially over the area of the mask; and
    etching the substrate through the mask to imprint a spatially patterned and spatially varying nanostructure pattern on a surface of the substrate, in accordance with the controlled, spatially varying nano-particle distribution of the mask, to thus transfer the nanostructured pattern of the mask onto the substrate, to form the optical component with a refractive index which varies over its area.

2. The method of claim 1, further comprising removing the mask from the substrate.

3. The method of claim 1, wherein the de-wetting of the thin metal material layer comprises using a laser to apply the spatially controlled irradiation to achieve de-wetting of the thin metal layer to form the mask.

4. The method of claim 3, wherein the laser is raster scanned over the mask.

5. The method of claim 4, wherein overlapping raster scanned passes of the laser are used to irradiate the thin metal layer to de-wet the thin metal layer.

6. The method of claim 1, wherein the de-wetting of the thin metal layer is performed using at least one light emitting diode (LED).

7. The method of claim 1, wherein the de-wetting of the thin metal layer is performed using thermal processing.

8. The method of claim 1, wherein the etching comprises performing a dry etching process to imprint the spatially patterned nanostructure pattern on the surface.

9. The method of claim 8, wherein the dry etching process comprises a reactive ion etching (RIE) process.

10. The method of claim 1, wherein the etching comprises performing a wet etching process.

11. A method for creating an optical component having a spatially controlled, varying refractive index which varies controllably over an area of the optical component, the method comprising:
    applying a thin metal layer to a substrate;
    de-wetting the thin metal layer by using an optical signal having an energy temporal deposition profile which is controlled to vary over an area of the thin metal layer, using pixels representing specific 2D areas, to create a mask having a controlled, spatially varying nano-particle distribution that varies spatially in a controlled pattern over an area of the mask, such that the controlled, spatially varying nano-particle distribution imparts different mask 16 and masked area throughout the mask;
    etching the substrate using the mask to imprint a spatially patterned, and spatially varying nanostructure pattern on a surface of the substrate, in accordance with the controlled, spatially varying nano-particle distribution of the mask, to thus transfer the mask to the surface of the substrate; and
    removing the mask to form an optical component having a refractive index which varies over its area.

12. The method of claim 11, wherein the de-wetting of the thin metal material layer comprises using a laser to generate the optical signal to achieve de-wetting of the thin metal layer to form the mask.

13. The method of claim 12, wherein the laser is raster scanned over the mask.

14. The method of claim 13, wherein overlapping raster scanned passes of the laser are used to irradiate the thin metal layer to de-wet the thin metal layer.

15. The method of claim 11, wherein the de-wetting of the thin metal layer is performed using at least one light emitting diode (LED).

16. The method of claim 11, wherein the etching comprises performing a dry etching process to imprint the spatially patterned nanostructure pattern on the surface.

17. The method of claim 16, wherein the dry etching process comprises a reactive ion etching (RIE) process.

18. The method of claim 11, wherein the etching comprises a wet etching process.

19. A method for creating an optical component having a spatially controlled and spatially varying refractive index over an area of the optical component, the method comprising:
   applying a thin metal layer to a substrate;
   using a laser having a controlled energy temporal deposition profile, using pixels representing specific 2D areas, to perform de-wetting of the thin metal layer to create a mask having a spatially controlled and spatially varying nano-particle distribution which is varied controllably over an area of the mask, to create different thicknesses and widths throughout the mask;
   using reactive ion etching to dry etch the substrate, and using the mask to control the etching, to imprint a spatially controlled, graded index surface on the substrate which varies spatially over the area of the optical component, in accordance with the controlled, spatially varying nano-particle distribution of the mask, to thus transfer the mask to the surface of the substrate; and
   removing the mask to form an optical component having a refractive index which varies over its area.

* * * * *